US010783950B2

United States Patent
Gupta et al.

(10) Patent No.: US 10,783,950 B2
(45) Date of Patent: Sep. 22, 2020

(54) MEMORY MANAGEMENT SYSTEMS AND METHODS USING A MANAGEMENT COMMUNICATION BUS

(71) Applicant: NVIDIA Corporation, Santa Clara, CA (US)

(72) Inventors: Alok Gupta, Fremont, CA (US); David Reed, Saratoga, CA (US)

(73) Assignee: Nvidia Corporation, Santa Clara, CA (US)

( * ) Notice: Subject to any disclaimer, the term of this patent is extended or adjusted under 35 U.S.C. 154(b) by 206 days.

(21) Appl. No.: 15/256,445

(22) Filed: Sep. 2, 2016

(65) Prior Publication Data

US 2017/0060429 A1    Mar. 2, 2017

Related U.S. Application Data

(60) Provisional application No. 62/213,552, filed on Sep. 2, 2015.

(51) Int. Cl.
| | | |
|---|---|---|
| *G11C 11/406* | (2006.01) | |
| *G11C 11/4096* | (2006.01) | |
| *G11C 11/409* | (2006.01) | |

(52) U.S. Cl.
CPC ...... *G11C 11/40603* (2013.01); *G11C 11/409* (2013.01); *G11C 11/4096* (2013.01); *G11C 11/40611* (2013.01)

(58) Field of Classification Search
CPC ......... G11C 11/40603; G11C 11/40611; G11C 11/409; G11C 11/4096
See application file for complete search history.

(56) References Cited

U.S. PATENT DOCUMENTS

2008/0010435 A1* 1/2008 Smith ................. G06F 11/1076
712/10
2012/0133423 A1* 5/2012 Kim .................. G11C 11/40618
327/524

(Continued)

FOREIGN PATENT DOCUMENTS

| TW | 200643974 | 12/2006 |
| TW | 201301279 | 1/2013 |

*Primary Examiner* — Tracy A Warren

(57) ABSTRACT

The present invention facilitates efficient and effective utilization of storage management features. In one embodiment, a system comprises: a storage component, a memory controller, and a communication link. The storage component stores information. The memory controller controls the storage component. The communication link communicatively couples the storage component and the memory controller. In one embodiment, the communication link communicates storage system management information between the memory storage component and memory controller, and communication of the storage system management information does not interfere with command/address information communication and data information communication. In one exemplary implementation, the communication link comprises: a data bus that communicates data; a command/address bus that communicates commands and addresses, wherein the command and the addresses are related to the storage of the data; and a management communication bus that communicates storage system management information.

12 Claims, 15 Drawing Sheets

(56) References Cited

U.S. PATENT DOCUMENTS

| | | | | |
|---|---|---|---|---|
| 2012/0144106 A1* | 6/2012 | Bains | ............... | G11C 11/40611 |
| | | | | 711/106 |
| 2013/0279283 A1* | 10/2013 | Seo | ................... | G11C 11/40611 |
| | | | | 365/222 |
| 2015/0134897 A1* | 5/2015 | Sriramagiri | ........... | G11C 11/406 |
| | | | | 711/106 |
| 2015/0194197 A1* | 7/2015 | West | ................... | G06F 11/1004 |
| | | | | 711/106 |

\* cited by examiner

MEMORY MANAGEMENT SYSTEMS AND METHODS USING A MANAGEMENT COMMUNICATION BUS

RELATED APPLICATIONS

This application claims the benefit of and priority to provisional application Ser. No. 62/213,552 entitled "DRAM Sideband Usage Systems and Methods" filed on Sep. 2, 2015, which is incorporated herein by reference.

FIELD OF THE INVENTION

The present invention relates to the field of information storage system configuration and management.

BACKGROUND OF THE INVENTION

Electronic systems and devices have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data in most areas of business, science, education, and entertainment. These electronic systems typically include storage of information in memory components. However, there are a variety of issues that can impact storage or memory performance.

Traditional storage or memory systems often have a number of storage management concerns. In some conventional storage systems the storage management concerns can be related to characteristics or features of the storage technologies or device themselves. Conventional approaches to management of storage devices typically involve memory controllers directing the management operations. While these approaches may permit the memory controller to maintain a fair amount of control, the memory controllers are not usually aware of dynamic issues that may arise on the storage device it self. For example, in traditional dynamic random access memory (DRAM) devices there is typically a need for refresh cycle which the memory controller issues. However, the memory controller is not typically notified of changing conditions on the DRAM (e.g., temperature, row hammer, etc.) that may impact the need for those refresh cycles. Some traditional approaches attempt polling a DRAM but this can interfere with other communications on a data and command/address bus.

Some traditional approaches attempted to allow the storage device to take control back from the memory controller. While this may help the storage device manage some activities, it can have a detrimental impact on overall performance. Traditional attempts that allow the storage device to take all or some of the management control from a memory controller do not typically consider other performance constraints such as isochronous timing requirements. For example, there have been some traditional proposals for a unidirectional sideband signal from the DRAM to the memory controller directing the memory controller to back-off when executing a read or write command because the DRAM has self-initiated a bank refresh in the background. This approach can be unsettling because it adds uncertainty to forward progress of commands, thus making it even more difficult to predict important isochronous timing behaviors and satisfy latency guarantees.

SUMMARY

The present invention facilitates efficient and effective utilization of storage management features. In one embodiment, a system comprises: a storage component, a memory controller, and a communication link. The storage component stores information. The memory controller controls the storage component. The communication link communicatively couples the storage component and the memory controller. In one embodiment, the communication link communicates storage system management information between the memory storage component and memory controller, and communication of the storage system management information does not interfere with command/address information communication and data information communication. In one exemplary implementation, the communication link comprises: a data bus that communicates data; a command/address bus that communicates commands and addresses, wherein the command and the addresses are related to the storage of the data; and a management communication bus that communicates storage system management information.

In one embodiment, the storage system management information comprises a request from a storage component, wherein the request is associated with performance of a management operation; and the memory controller initiates an action in response to the request related to performance of the management operation. In one exemplary implementation, the request can be for an adjustment in refresh cycle operations and the memory controller can implement an adjustment in response. The request can be for an adjustment in environmental conditions and the memory controller initiates an adjustment to the storage components environment in response. The storage component can be a dynamic random access memory (DRAM). The communication of the management information can be a sideband communication. The storage system management information can comprise status information forwarded from the storage device to the memory controller, and the status information can be an indication relating to a portion of the storage device. The portion of the storage device can be selected from the group comprising: a bit of memory, a byte of memory, a row of memory, a block of memory, and a page of memory.

In one embodiment, a method comprises: receiving storage system management information from a storage component; analyzing the storage system management information, including determining a response to the storage system management information, wherein the analyzing is performed in a memory controller and the memory controller maintains discretion regarding the response; and selectively issuing instructions corresponding to storage system management operations in accordance with results of the analyzing, wherein the memory controller maintains control of issuing the instructions. The determining the response can include considering impacts of the response on both data storage operations and storage system management requirements. The directions can result in flexible dynamic adjustment of storage system management operations. In one embodiment, a communication of the storage system management information does not interfere with communication of data, command information, and address information between the memory controller and the storage component. The communicating can be performed via a plurality of communication buses, including a management communication bus that communicates storage system management information.

In one embodiment a system comprises: a storage device that stores information; a memory controller that controls the storage component, wherein the memory controller maintains control of storage system management instructions; and a communication link that communicatively couples the storage component and the memory controller. The communication link communicates storage system management information between the memory storage component and memory controller, and communication of the storage system management information does not interfere with command/address information communication and data information communication. The memory controller is configured to receive and forward storage system management information from and to the storage device.

In one embodiment, the communication link comprises: a data channel that is dedicated to data communications; a command/address channel that is dedicated to communication of commands and addresses, wherein the commands and the addresses are related to the storage of the data; and a sideband management communication channel that is dedicated to the communication of the storage system management information. The storage system management information can comprise a request from a storage component, wherein the request can be associated with performance of a management operation; and an action can be implemented by the memory controller related to performance of the management operation. The request can be for an adjustment in the rate of refresh cycle operations and the response can include actions to implement the adjustment. The management communications can comprise refresh rate instructions, temperature control information, storage device status information, storage device row and page availability information, and so on.

DESCRIPTION OF THE DRAWINGS

The accompanying drawings, which are incorporated in and form a part of this specification, are included for exemplary illustration of the principles of the present invention and not intended to limit the present invention to the particular implementations illustrated therein. The drawings are not to scale unless otherwise specifically indicated.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

In one embodiment, management systems and methods facilitate increased performance through the use of a storage system management communication channel. The storage system management communication channel can enable communication of storage system management information while alleviating communication demands on other communication channels (e.g., data communication channel, command communication channel, address communication channel, etc.) that would otherwise occur. The storage system management information can also facilitate robust intelligent memory control of various management operations.

Figure 1:
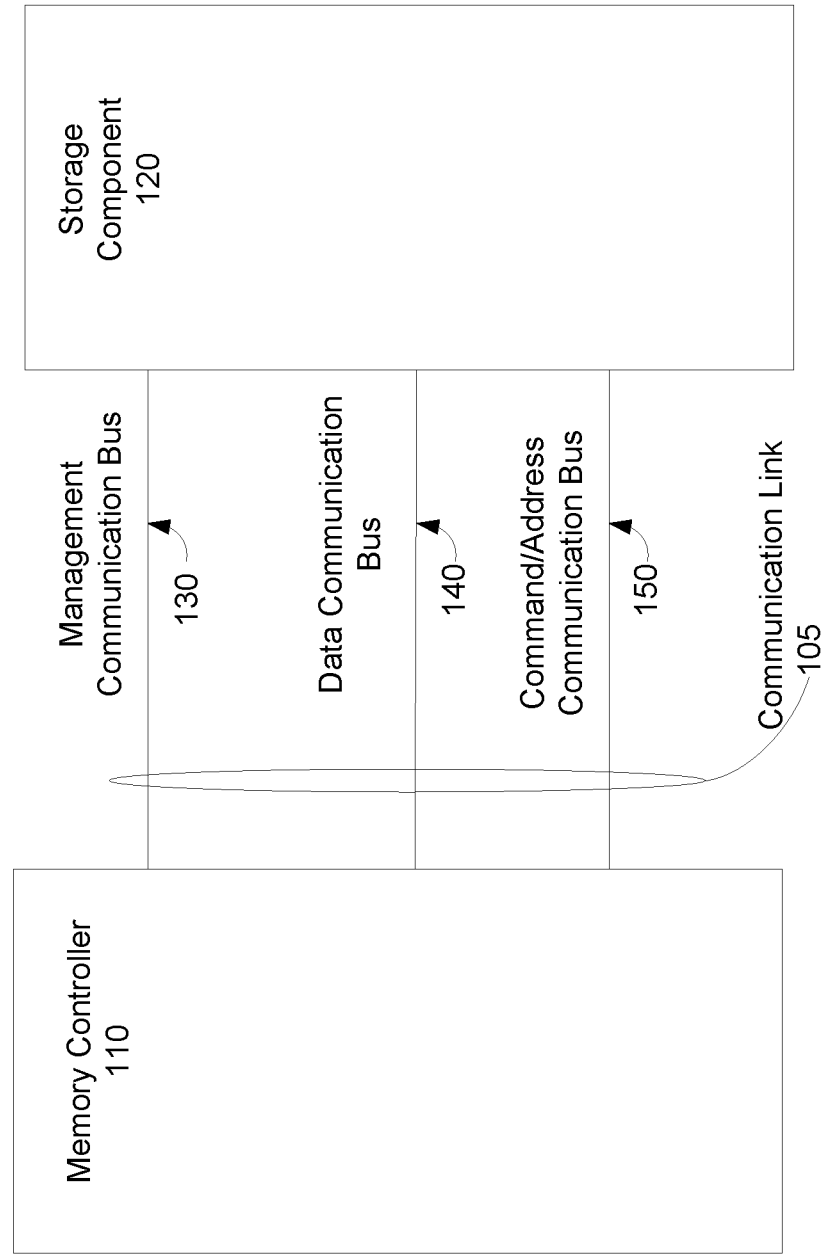
FIG. 1 is a block diagram of an exemplary storage management system in accordance with one embodiment.

FIG. 1 is a block diagram of an exemplary storage management system 100 in accordance with one embodiment. System 100 includes memory controller 110, storage component 120, and communication link 105. Communication link 105 includes management communication bus 130, data communication bus 140, and command/address bus 150. Storage component 120 stores information. Memory controller 110 controls the storage component. Communication link 105 communicatively couples storage component 120 and the memory controller 110. Data bus 140 communicates data. Command/address bus 150 communicates commands and addresses are related to storage of the data. Management communication bus 130 communicates management information. In one embodiment, management communication bus 130 provides an alternative path for communicating management information and the communication of the information does not interfere with the communications on other buses (e.g., on the data bus 140, command/address bus 150, etc.).

Communicating management information on management bus 130 alleviates or reduces consumption of communication bandwidth on other buses (e.g., data bus 140, command/address bus 150, etc.) that would otherwise occur if the management information was communicated on the other busses. In one embodiment, the savings or freeing up of bandwidth on the other buses enables that bandwidth to be used to communicate other information and facilitates overall increased performance of the storage system. The management information communicated via management bus 130 can also facilitate more robust memory control by memory controller 110 which in turn can also increase performance of the storage system. In one embodiment, the management communication bus also facilitates communication of more management information (e.g., greater granularity in refresh rate changes, more information related to storage component temperature, error correction related information, etc.) than would otherwise be communicated between the memory controller and storage device in a traditional approach.

Management information communicated on management communications bus 130 can be directed to a variety of management operations (e.g., refresh cycle management information, temperature management information, error correction information, etc.). In one embodiment, the management information is associated with management of storage component 120 and includes a request associated with the refresh operations. In one exemplary implementation, the storage component 120 can request a change in timing or rate at which the memory controller 110 issues refresh commands.

It is appreciated the management information can be communicated via a variety of mechanisms (e.g., a sideband channel, a bus, etc.). A management bus can be directional or unidirectional. In one embodiment, a bus can be dedicated to a particular communications (e.g., a data bus dedicated to data communications, command/address bus to command and address communications, management bus dedicated to management communications, etc.). In one embodiment, information is communicated on a respective bus based upon the nature or characteristics of the information. It is appreciated that some information may have a dual nature or characteristic. In one embodiment, a refresh cycle command is communicated on a command bus and not the management information bus, even through a refresh cycle command is associated with an internal DRAM bank management operation. In one exemplary implementation, even though a refresh command may be communicated on the command/address bus 150, a request from the storage component or device 120 to change the refresh command rate is not communicated on and does not consume bandwidth on the data bus 130 or the command/address bus 150. Rather, the request from the storage component 120 to the memory controller 110 to adjust the refresh command rate is communicated via the management bus 130.

Figure 2:
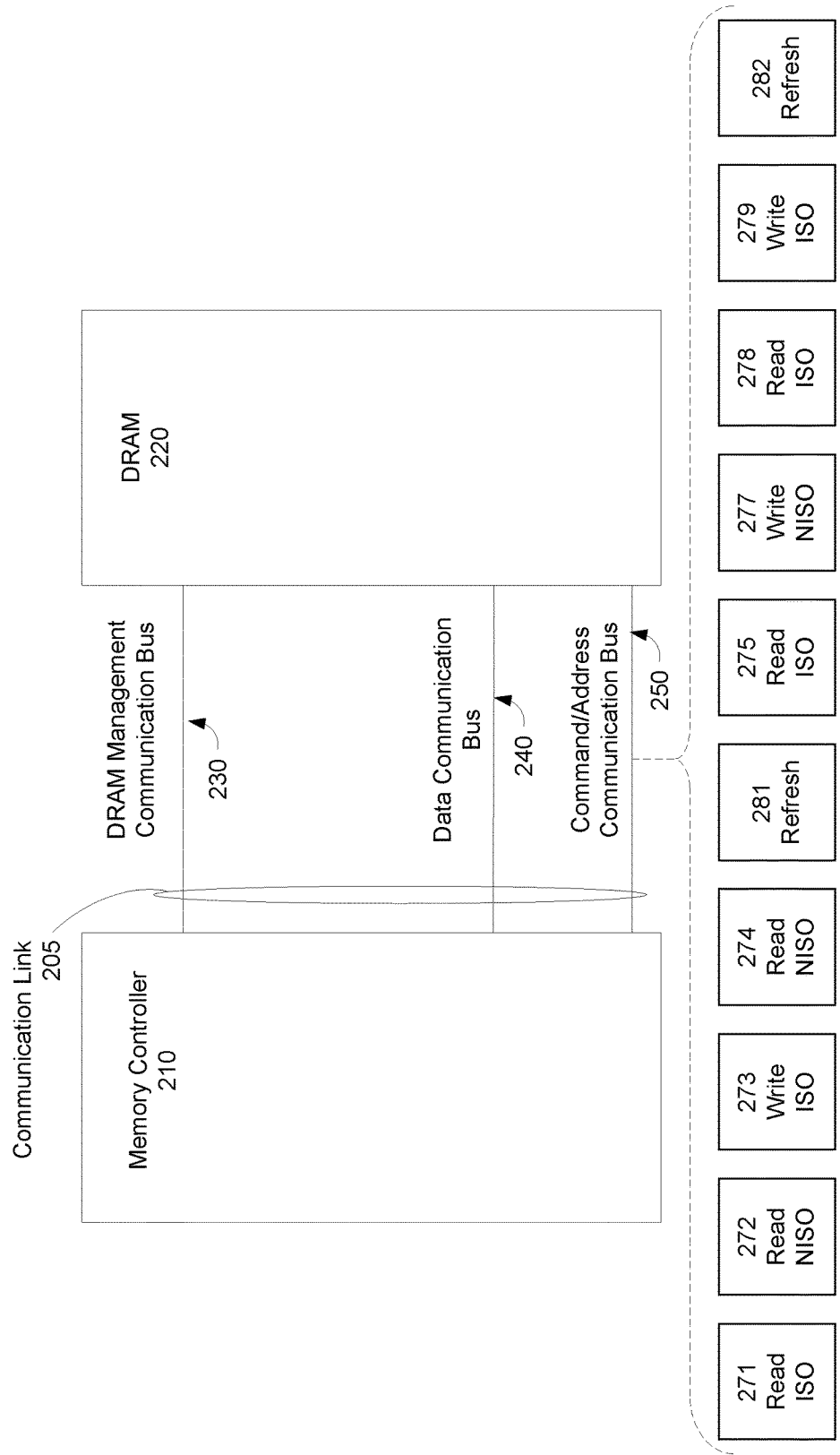
FIG. 2 is a block diagram of an exemplary storage management system in accordance with one embodiment.

FIG. 2 is a block diagram of exemplary storage management system 200 in accordance with one embodiment. Storage management system 200 is similar to storage management system 100. System 200 includes memory controller 210, storage component 220, and communication link 205. Communication link 205 includes management communication bus 230, data communication bus 240, and command/address bus 250. Storage component 220 stores information. Memory controller 210 controls the storage component. Communication link 205 communicatively couples storage component 220 and the memory controller 210. Data bus 240 communicates data. Command/address bus 250 communicates commands and addresses between memory controller 210 and storage component 220. The commands and addresses are related to access to storage locations associated with the data. Management communication bus 230 communicates management information.

In one embodiment, commands associated with particular addresses are issued from the memory controller 210 to storage component 220 via command/address communication bus 250 and the data associated with the commands is communicated between memory controller 210 and storage component 220 via data communication bus 240. The direction of the data communication can change depending upon whether reading or writing data. In one exemplary implementation, the storage access commands include an isochronous (ISO) read command in communication slot 271, a non-isochronous (NISO) read command in communication 272, an ISO write command in communication slot 273, a NISO read command in communication slot 274, an ISO read command in communication slot 275, a NISO write command in communication slot 277, an ISO read command 278 and an ISO write command in communication slot 279. The refresh rate for issued refresh cycle commands in communication slots 281 and 282 can be a default or standard rate. In the present example, the default refresh cycle rate corresponds to refresh cycle commands being issued every 5th communication slot.

In one exemplary implementation, DRAM 220 issues a request for a particular refresh cycle rate. The refresh cycle request communication via management communication bus 230 does not interfere with communication of storage command and address information via command/address communication bus 250.

Figure 3:
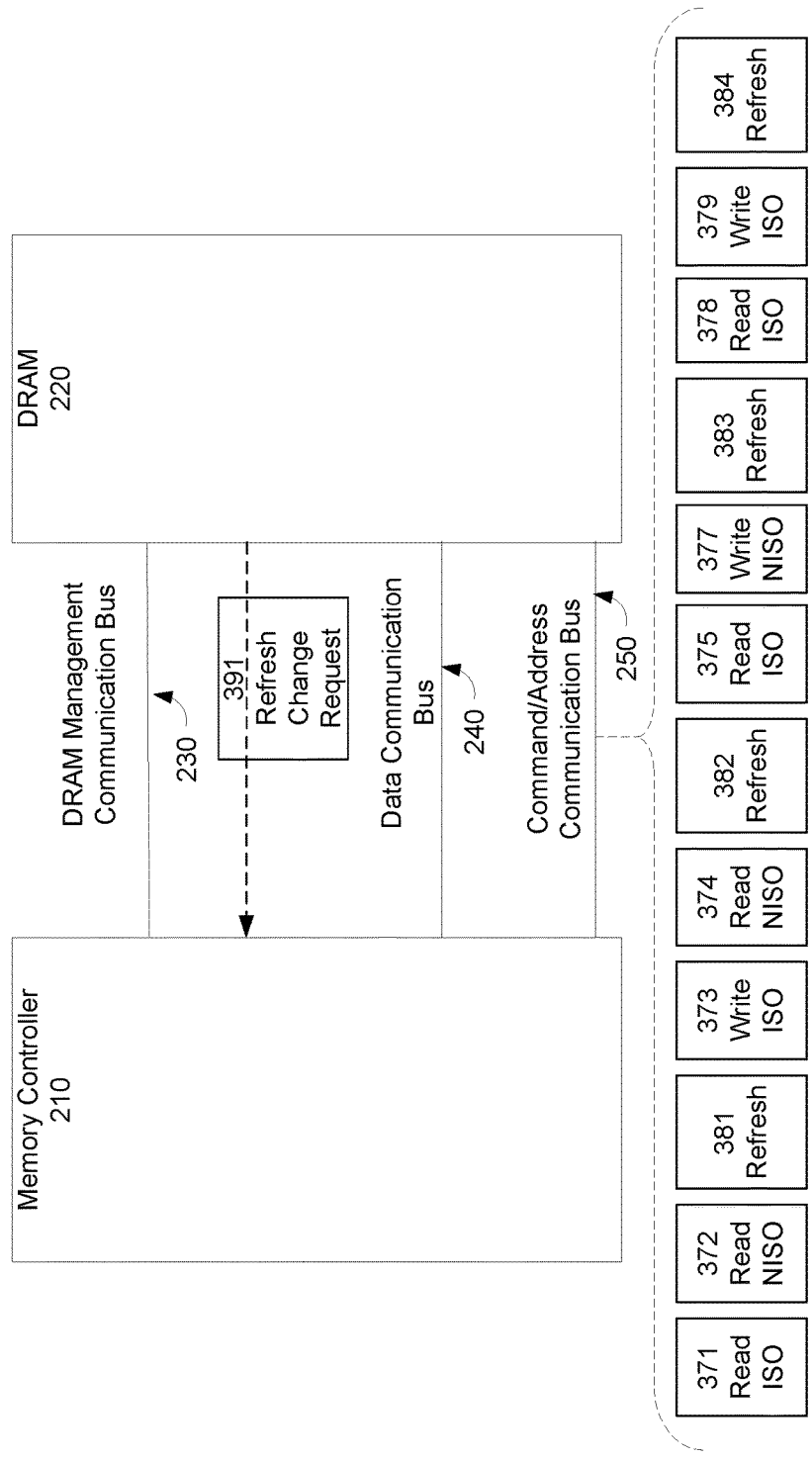
FIG. 3 is a block diagram of an exemplary storage management system with a refresh rate change request in accordance with one embodiment.

FIG. 3 is a block diagram of exemplary storage management system 200 with a refresh rate change request in accordance with one embodiment. In one exemplary implementation, the storage access commands again include an isochronous (ISO) read command in communication slot 371, a non-isochronous (NISO) read command in communication slot 372, an ISO write command in communication slot 373, a NISO read command in communication slot 374, an ISO write command 375, a NISO write command in communication slot 377, an ISO read command in communication slot 378 and an ISO write command in communication slot 379. However, in FIG. 3 the DRAM 220 forwards refresh cycle rate change request 391 to memory controller 210 via the management communication bus 230. In one exemplary implementation, the DRAM request is to increase the refresh cycle rate and the adjusted refresh cycle rate corresponds to issuing a refresh cycle request every third communication slot. The memory controller 210 responds by increasing the refresh rate and issues the refresh cycle commands in communication slots 381, 382, 383, and 384. The refresh cycle command adjustment request communication via management communication bus 230 does not interfere or consume bandwidth on data bus 240 or command/address communication bus 250, unlike a traditional approach.

Figure 4A:
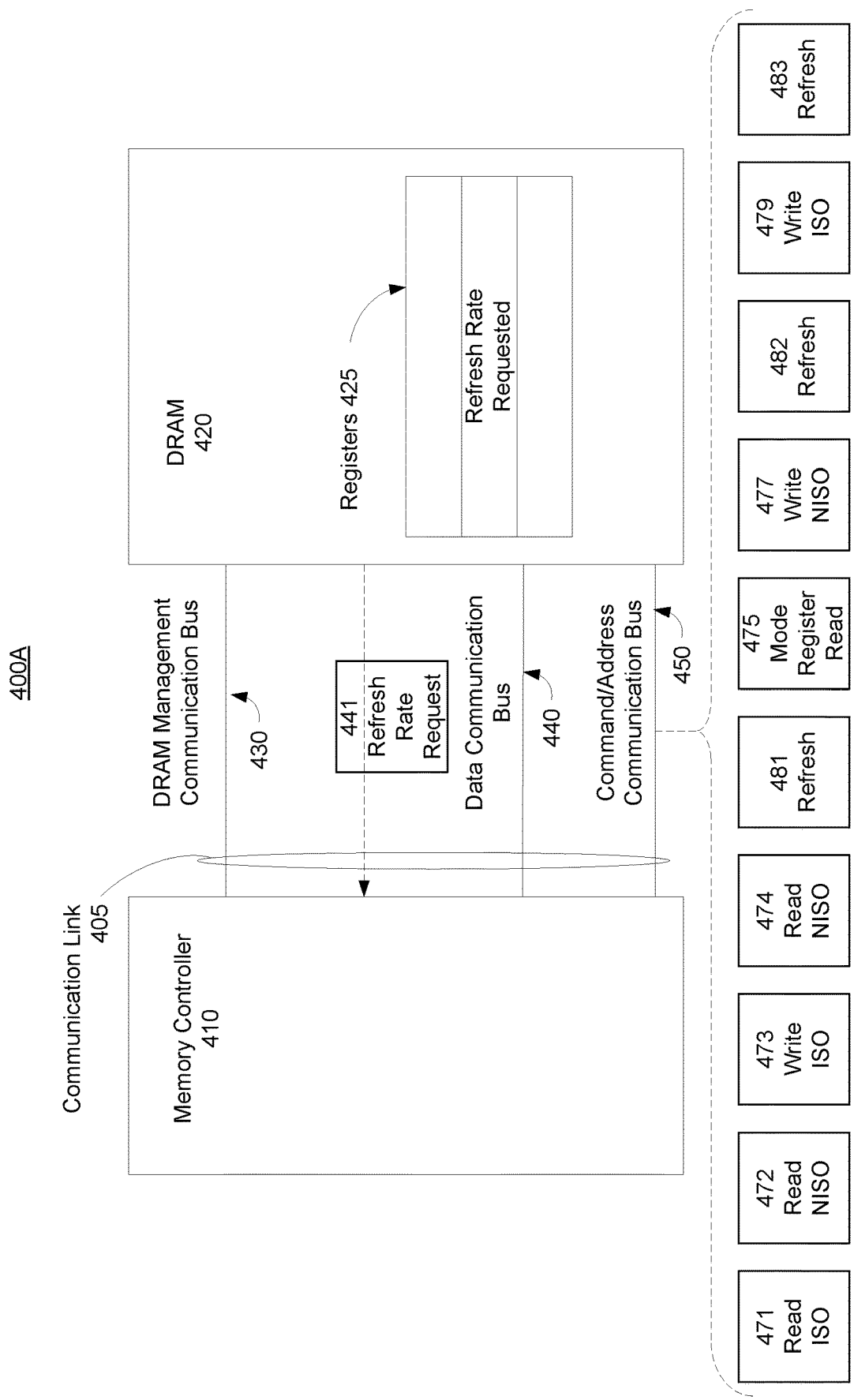
FIG. 4A is a block diagram of an exemplary traditional storage system in which the storage device refresh cycle request interferes with communication of access commands and addresses in accordance with one embodiment.

FIG. 4A is a block diagram of an exemplary traditional storage system 400A in which the storage device refresh cycle request interferes with communication of access commands and addresses in accordance with one embodiment. System 400A includes memory controller 410, storage component 420, data communication bus 440, and command/address bus 450. Storage component 420 stores information. Memory controller 410 controls the storage component 420.

Data bus 440 communicates data between memory controller 410 and storage component 420. Command/address bus 450 communicates commands and addresses between memory controller 410 and storage component 420. The command and address are related to access to storage locations associated with the data. In one embodiment, commands associated with particular addresses are issued from the memory controller 410 to storage component 420 via command/address communication bus 450 and the data associated with the commands is communicated between memory controller 410 and storage component 420 via data communication bus 440. In one exemplary implementation, storage system management information is also communicated via data communication bus 440 and command/address bus 450. The storage system management information occupies communications slots and consumes bandwidth on the data communication bus 440 and command/address bus 450 preventing or interfering with data, command or address information from using those communication slots.

In one exemplary implementation, the storage access commands include an isochronous (ISO) read command in communication slot 471, a non-isochronous (NISO) read command in communication slot 472, an ISO write command in communication slot 473, a NISO read command in communication slot 474, a NISO write command in communication slot 477, and an ISO write command in communication slot 479. Initially the refresh cycle rate corresponds to issuing a refresh command every 5 communication slot. Thus, a refresh command is issued in communication slot 481. In one exemplary implementation, the memory controller periodically polls a DRAM mode register for updated refresh rate information. In the present example, the memory controller 410 issues a mode register read command on command/address communication bus 450. The updated refresh cycle rate information is retrieved from the select mode register 425 and forwarded back to the memory controller 410 via the data communications bus 440 in communications slot 441. In the present example the new requested refresh cycle command corresponds to issuing a refresh command every two communications slots. Thus, a refresh cycle command is issued in communications slots 482 and 483.

The insertion of the mode register access to fetch refresh management information interferes with communication of storage information via the data communication bus 440 and command/address communication bus 450. In the present example the mode register read command in communication slot 475 consumes bandwidth on command/address communication bus 450 and the refresh rate request data in communication slot 441 consumes bandwidth on the data communications bus 440. By comparing the access commands issued in the example illustrated in storage system 200 in FIG. 2, it can be understood that less access commands can be issued in the same period of time by the storage system 400A in FIG. 4 because the refresh cycle request is inserted in the same communication stream as the data and the mode register read command is inserted in the same communication stream as the address and other commands.

The insertion of the mode register access to fetch refresh management information interferes with communication of storage information via the data communication bus 440 and command/address communication bus 450. In the present example the mode register read command in communication slot 475 consumes bandwidth on command/address communication bus 450 and the refresh rate request data in communication slot 421 consumes bandwidth on the data communications bus 440. By comparing the access commands issued in the example illustrated in storage system 200 in FIG. 2, it can be understood that less access commands can be issued in the same period of time by the storage system 400A in FIG. 4 because the refresh cycle request is inserted in the same communication stream as the data and the mode register read command is inserted in the same communication stream as the address and other commands.

Figure 4B:
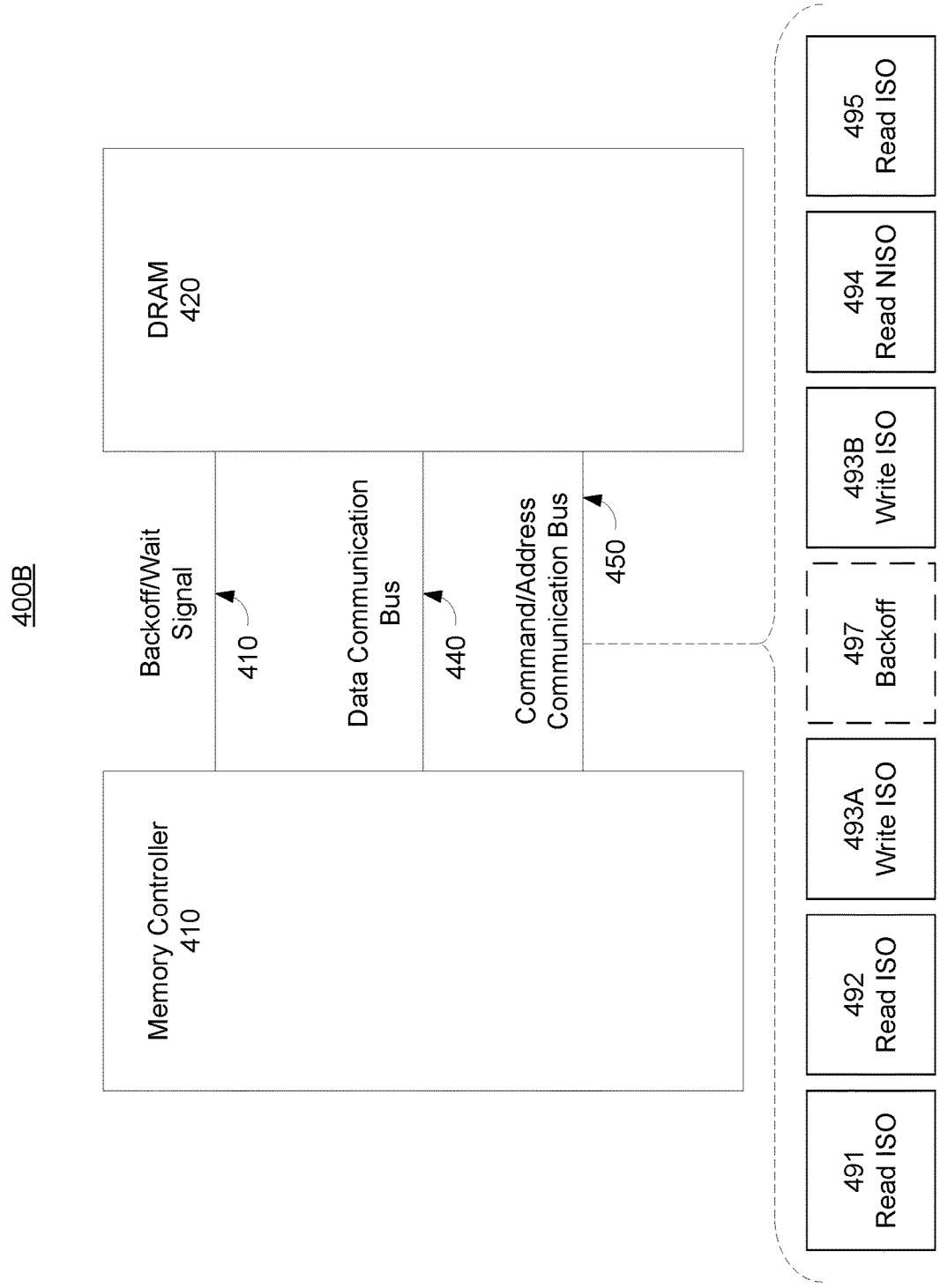
FIG. 4B is a block diagram of an exemplary storage system in which the refresh cycle management operations interfere with communication of data, commands and address information in accordance with one embodiment.

FIG. 4B is a block diagram of an exemplary storage system 400B in which the refresh cycle management operations interfere with communication of data, commands, and address information in accordance with one embodiment. System 400B is similar to system 400A except system 400B includes a backoff or wait signal. In one exemplary implementation, the storage access commands include an isochronous (ISO) read command in communication slot 491, a non-isochronous (NISO) read command in communication slot 492, an ISO write command in communication slot 493A, an ISO write command in communication slot 493B, a NISO read command in communication slot 494, and an ISO read command in communication slot 495. In one embodiment, DRAM 420 issues a wait or backoff signal to the memory controller 410 when DRAM 420 initiates or has initiated a refresh cycle on its own that internally would conflict with a memory controller. This traditional approach of issuing a wait or backoff signal to the memory controller can have adverse impacts to overall performance. While the DRAM 420 may be able to perform the refresh cycle it wants, the communication of data on data communications bus 440 and the communication of commands and addresses on the command/address bus 450 are in effect impacted or interfered with by the wait or stall. In the present example, DRAM 420 issues a backoff or wait signal 410. This causes an interference in command/address bus as no information is communicated during the backoff time or slot 497 and the write ISO command in communication slot 493A has to be reissued in communication slot 493B. The desire by the DRAM to have input into the refresh cycle operations via this backoff or wait approach basically removes refresh cycle control from the memory controller 410, which in turn interferes with the memory controllers ability to ensure overall performance requirements are met.

Storage systems and methods with management communication channel capabilities enable the storage device to have input to management operations while permitting the memory controller to maintain control of operations that would otherwise have a detrimental impact on performance. It is appreciated that the memory controller can respond to the management related information received from the storage device via the management channel in a variety of ways. In one embodiment, the memory controller intelligently considers a number of different factors when responding to the storage device input. The memory controller can consider other memory access or communications (e.g., related to isochronous requests, non-isochronous requests, etc.). In one embodiment, a memory controller utilizes information received via the management communication bus to initiate various actions. The received information can relate to row hammer, indications of error occurrences (e.g., related to ECC, CRC, etc.), requests for the memory controller to initiate an action (e.g., adjust refresh rates, adjust a frequency, adjust a fan, adjust the system temperature, mark as bad or de-allocate a portion of a storage component, etc), and so on. In one embodiment, the memory controller maintains independent control and discretion of initiating actions in response to the received information. In one exemplary implementation, the memory controller can facilitate intelligent management of the various components. The intelligent management can include tracking and analyzing error indications (e.g., for a storage component, for a communication channel, etc.) and intelligently initiating a course of action in response (e.g., initiate a refresh cycle, treat a portion of a storage component as bad, provide notification that a storage component should be replaced, initiate recalibration of a communication channel, etc.).

Refresh is typically included in DRAM and as process nodes shrink the cell capacitor charge drops and the probability of bit errors increases adding pressure for shorter gaps between refresh cycles (e.g., higher refresh cycle rates, etc.). Evidence of this is in the accommodation in modern DRAM data link protocols to allow for a RMW internal to the DRAM at the array when a partial write (WR burst with byte mask) is executed on the DRAM interface (The RMW is required to merge a complete Burst Length of data through a DRAMs hidden internal error correction logic). DRAM capacitor leakage can also increase with increasing temperature and has an inverse relationship with the refresh period required to maintain valid data. In one embodiment, a DRAM has a knowledge of its process states and current physical states (e.g., a DRAM can track its temperature, capacitance leakage, etc.) and requests refresh cycles accordingly. In one embodiment, the period between refreshes of a cell can be measured in msec so a few usec delay using a sideband request to change the rate at which refresh cycles occur is reasonable.

Figure 14:
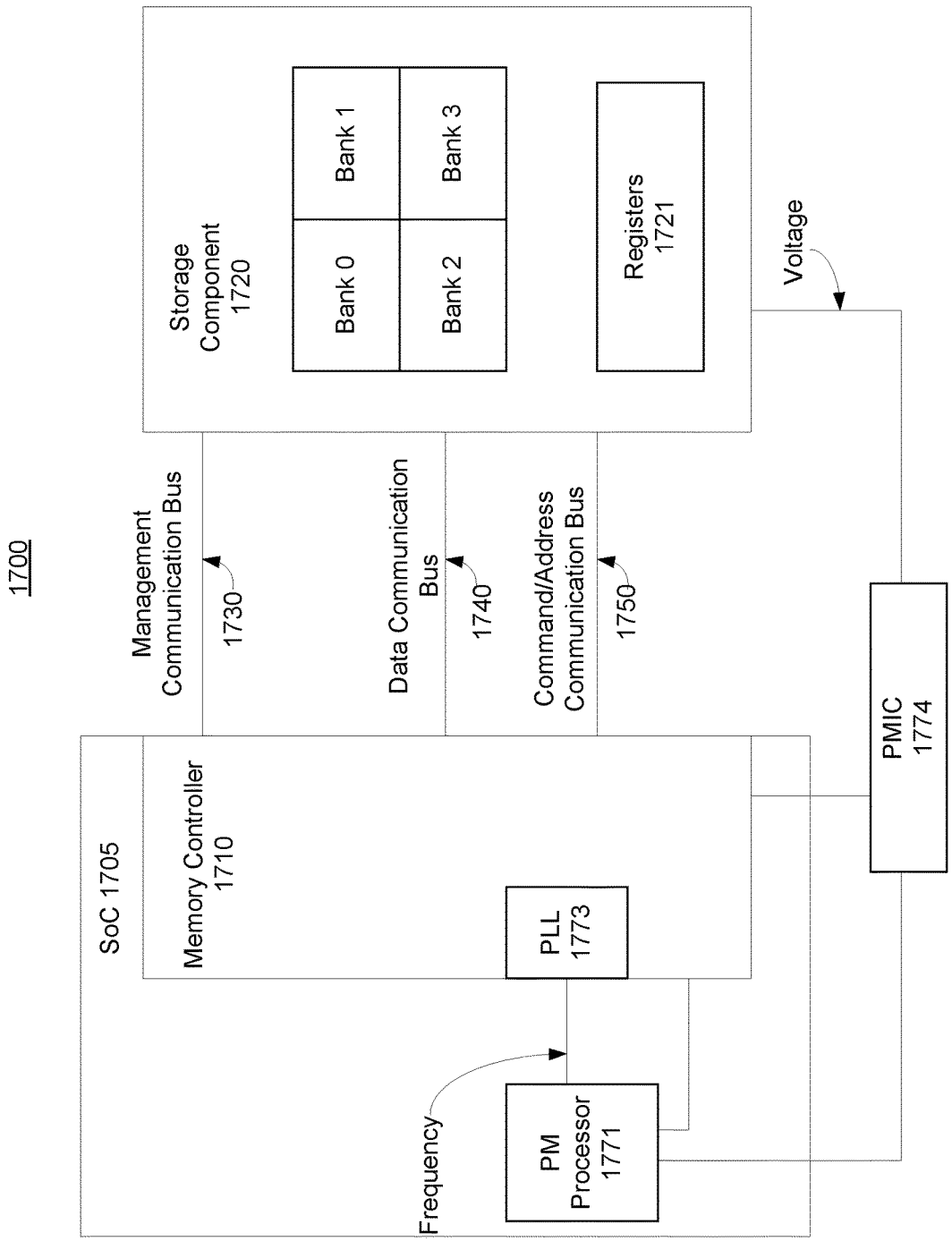
FIG. 14 is a block diagram of an exemplary computing system in accordance with one embodiment.

FIG. 14 is a block diagram of an exemplary computing system 1700 in accordance with one embodiment. Computing system 1700 includes system on chip SoC 1705, memory controller 1710, storage component 1720, management communication bus 1730, data communication bus 1740, command/address communication bus 1750, power management integrated circuit (PMIC) 1774 and power management (PM) processor 1771. Storage component 1720 includes registers 1721 and storage banks 0, 1, 2, and 3. Memory controller 1710 includes PLL 1773. Memory controller 1710 can receive status information from registers 1721 via management communication bus 1730. In response to the status information memory controller 1710 can initiate or request actions by PMIC 1774 or PM processor 1771 (e.g., change frequency, change voltage, etc.).

Figure 5:
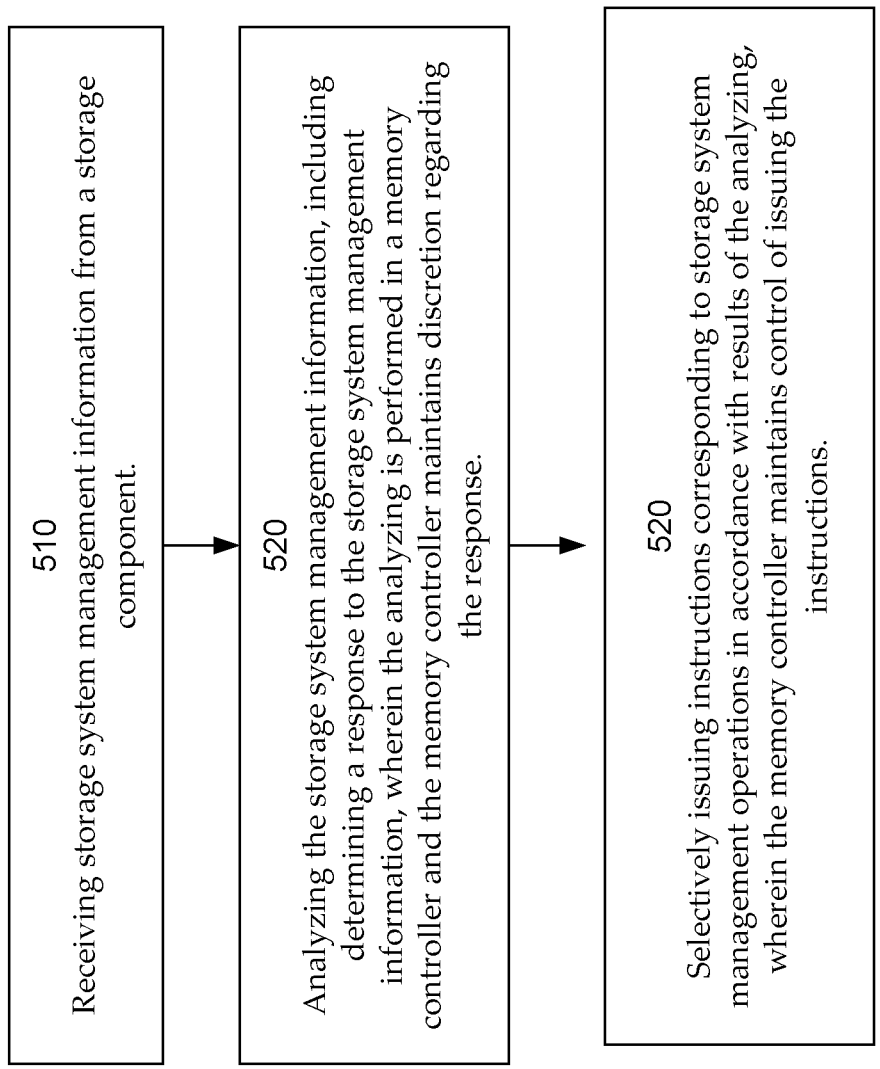
FIG. 5 is a flow chart of an exemplary storage method in accordance with one embodiment.

FIG. 5 is a flow chart of an exemplary storage method 500 in accordance with one embodiment. In one exemplary implementation, storage method 500 is implemented on a storage system (e.g., similar to storage system 100, storage system 200, etc.).

In block 510, storage system management information is received from a storage component. In one embodiment, the storage component is a DRAM. In one exemplary implementation, communication of the storage system management information does not interfere with communication of data, command information, and address information between the memory controller and the storage component.

In block 520, the storage system management information is analyzed. The analysis can include determining a response to the storage system management information, wherein the analyzing is performed in a memory controller and the memory controller maintains discretion regarding the response. The determining the response can include considering impacts of the response on both data storage operations and storage system management requirements.

In block 530, instructions are selectively issued corresponding to storage system management operations in accordance with results of the analyzing, wherein the memory controller maintains control of issuing the instructions. The instructions can result in flexible dynamic adjustment of storage system management operations.

In one embodiment, communication of information is performed via a plurality of communication buses. The plurality of communication buses can comprise: a data bus (e.g., similar to data bus 140, data bus 240, etc.) that communicates data, a command/address bus (e.g., similar to command/address bus 150, command/address bus 250, etc.) that communicates commands and addresses related to storage of the data, and a management communication bus (e.g., similar to management communication bus 130, management communication bus 230, etc.) that communicates storage management information.

Figure 7:
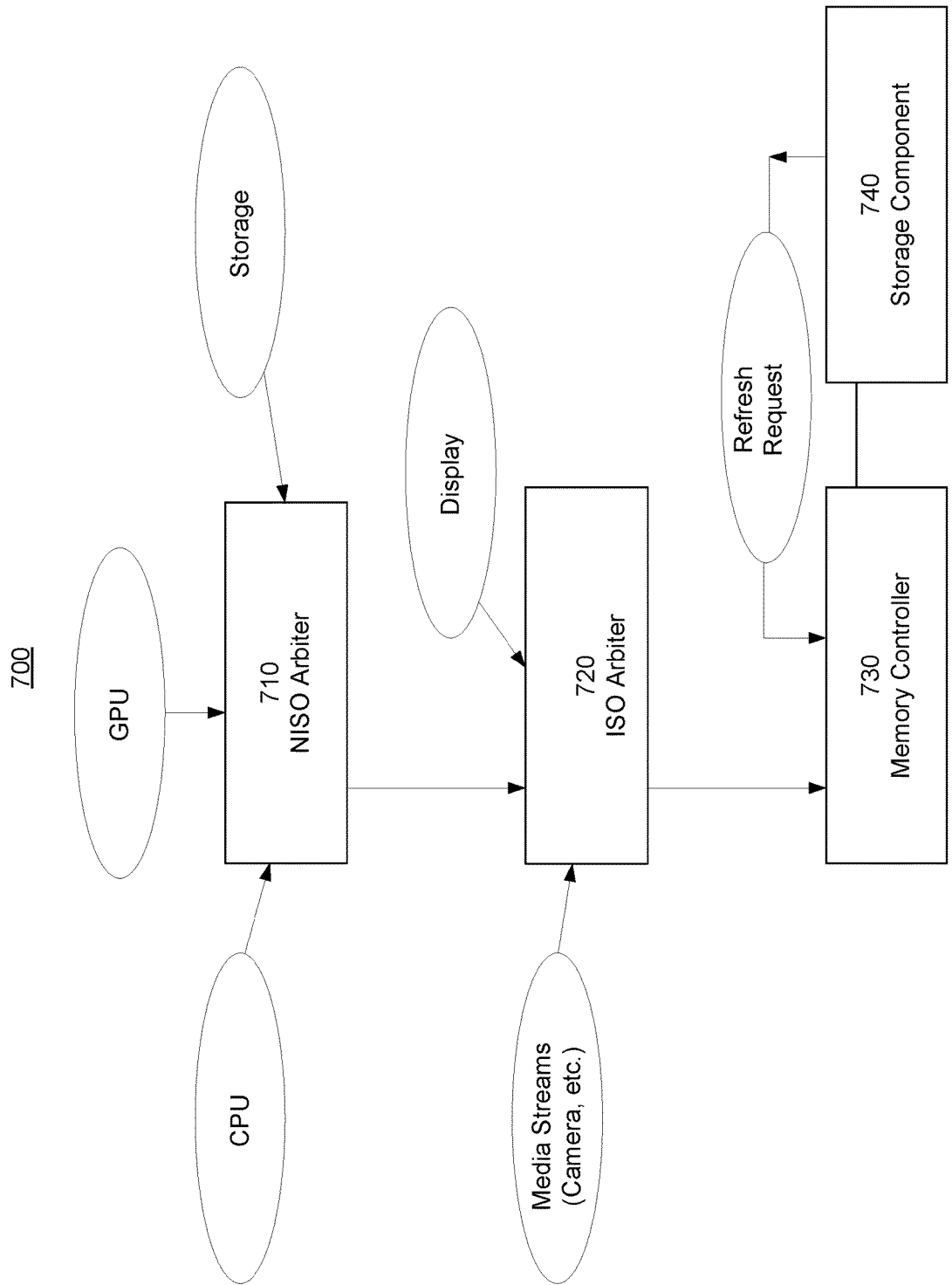
FIG. 7 is a block diagram of an exemplary computing system including a memory controller in accordance with one embodiment.

FIG. 7 is a block diagram of a storage system 700 in accordance with one embodiment. Storage system 700 includes NISO arbiter 710, ISO arbiter 720 and Memory Controller 730 and storage component 740. NISO arbiter 710 receives non-isochronous information (e.g., inputs from a central processing unit, a graphics processing unit, bulk storage, etc.) and schedules corresponding access requests which are forwarded to memory controller 730. ISO arbiter 720 receives isochronous information (e.g., from a media stream component, a display, etc.) and schedules corresponding access requests which are forwarded to memory controller 730. Memory controller 730 receives refresh rate requests from storage device 740 via a management bus and initiates actions to address the refresh request.

The physical communication of the management information can be accomplished through a variety of mechanisms or communication mediums. In one exemplary implementation, point-point or multi-drop bus and associated protocols are used.

Figure 8:
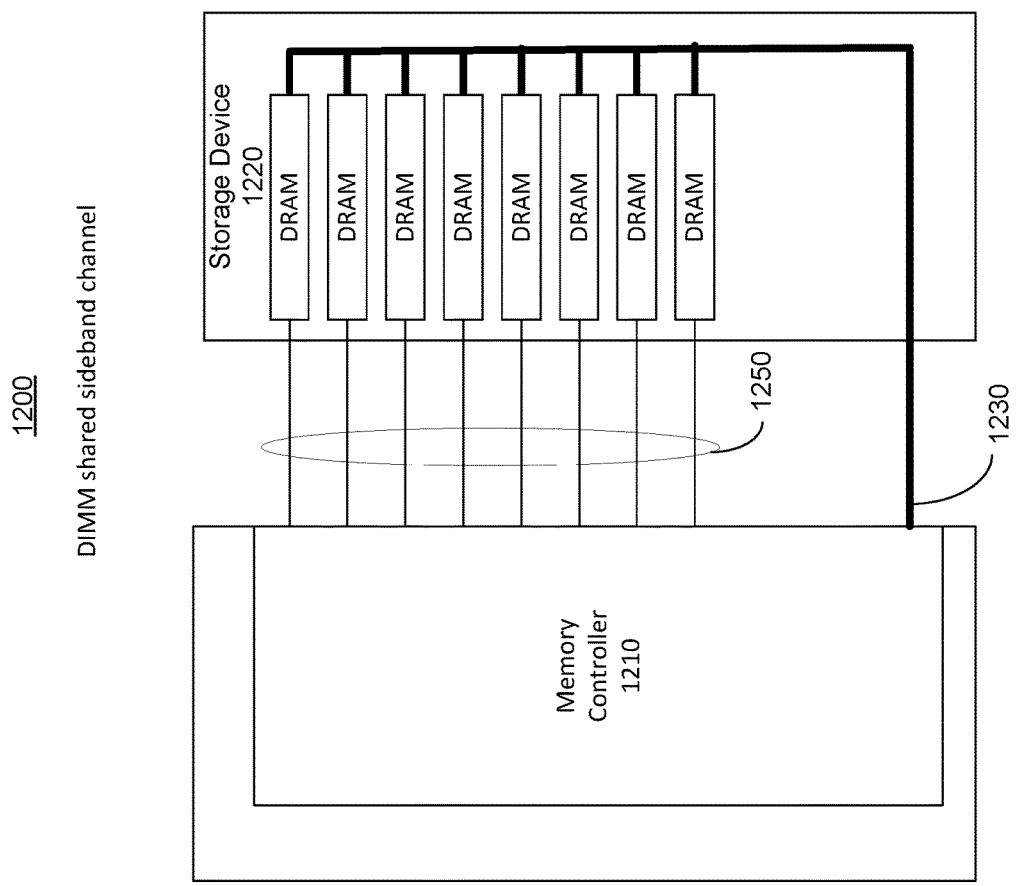
FIG. 8 is a block diagram of an exemplary storage system in a DIMM shared sideband channel configuration in accordance with one embodiment.

FIG. 8 is a block diagram of a storage system 1200 in a DIMM shared sideband channel configuration in accordance with one embodiment. Storage system 1200 includes memory controller 1210 and storage device 1220. In one embodiment, storage device 1220 is a DIMM. Communications on sideband channel management bus 1230 do not interfere with communications on command/address buses and data buses 1250.

Figure 9:
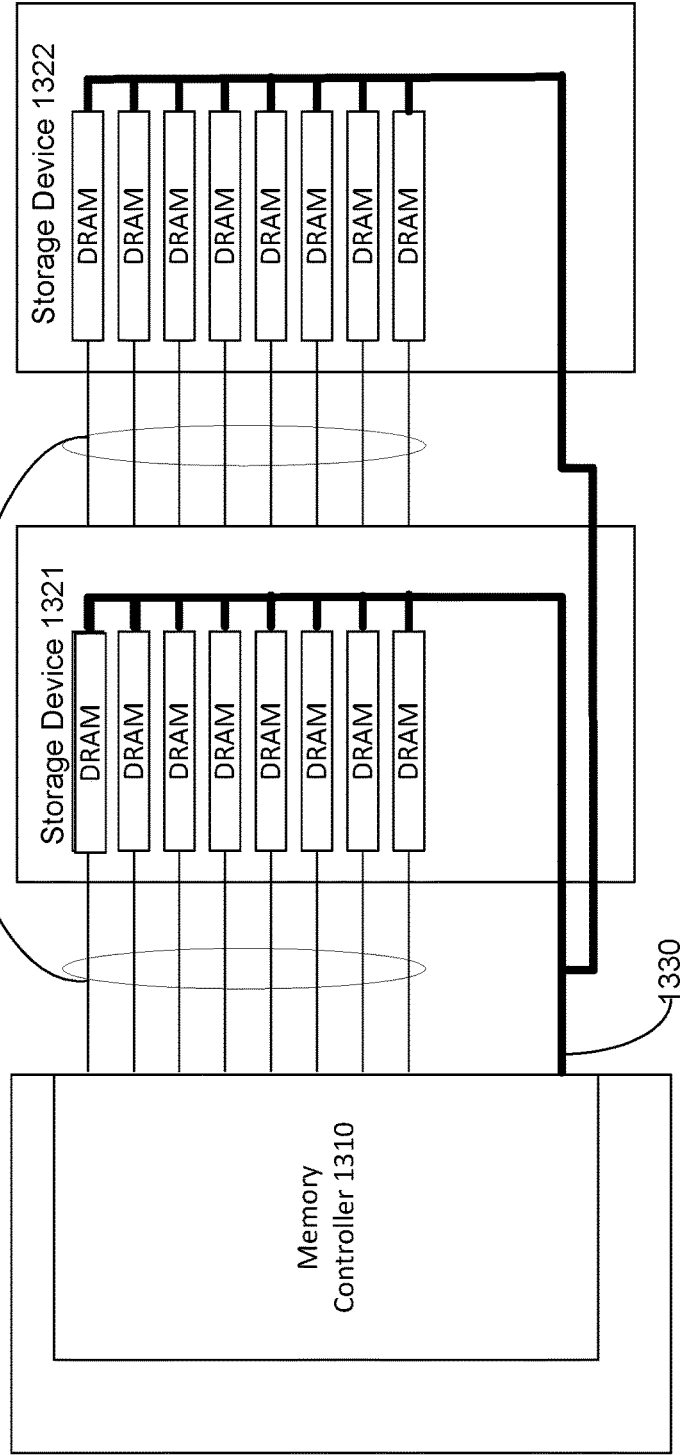
FIG. 9 is a block diagram of an exemplary storage system in a Multi-DIMM shared sideband channel configuration in accordance with one embodiment.

FIG. 9 is a block diagram of a storage system 1300 in a Multi-DIMM shared sideband channel configuration in accordance with one embodiment. Storage system 1300 includes memory controller 1310 and storage devices 1321 and 1322. In one embodiment, storage devices 1321 and 1322 are DIMMs. Communications on sideband channel management bus 1330 do not interfere with communications on command/address buses and data buses 1350.

Figure 10:
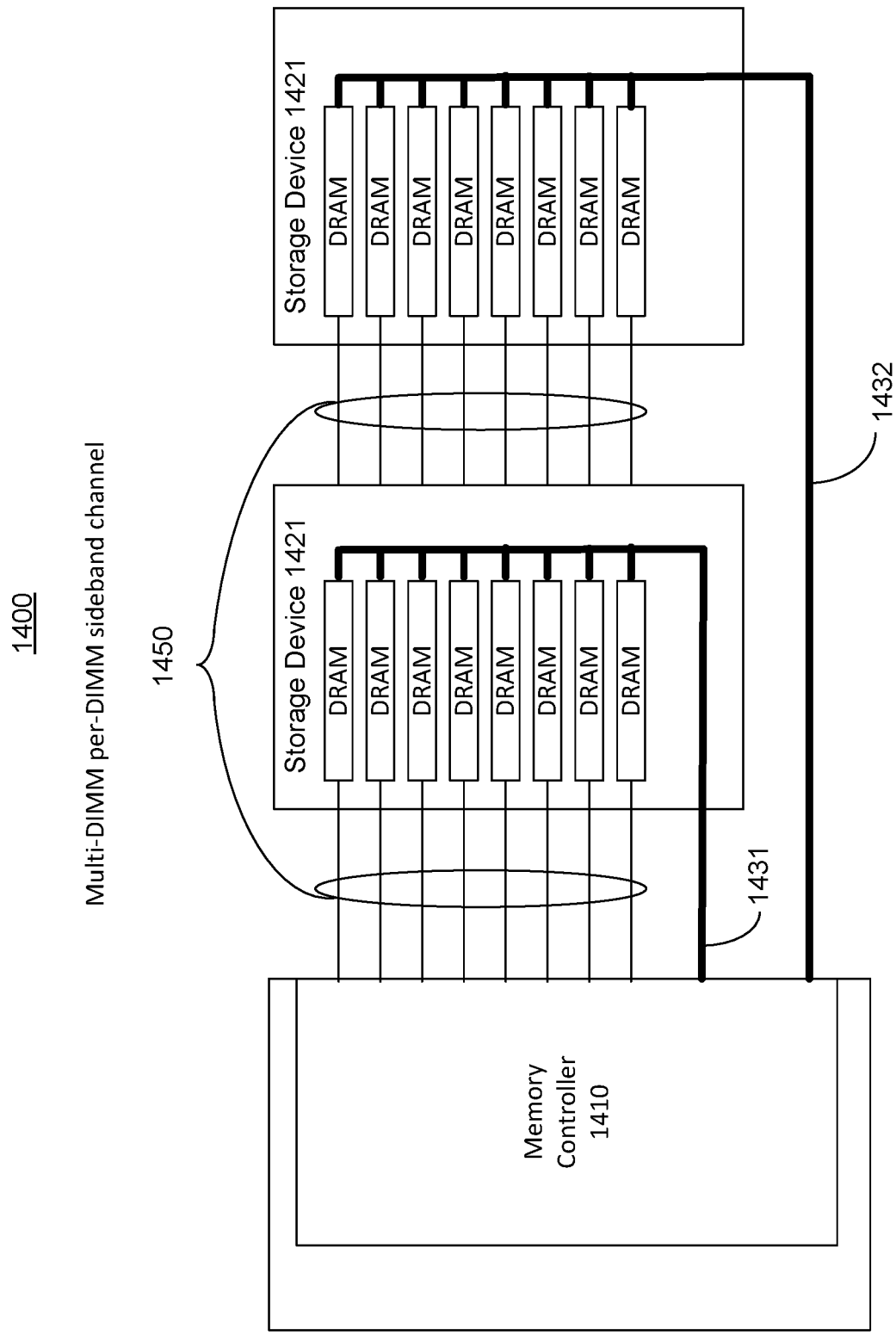
FIG. 10 is a block diagram of an exemplary storage system in a Multi-DIMM sideband channel per DIMM configuration in accordance with one embodiment.

FIG. 10 is a block diagram of a storage system 1400 in a Multi-DIMM sideband channel per DIMM configuration in accordance with one embodiment. Storage system 1400 includes memory controller 1410 and storage devices 1421 and 1422. In one embodiment, storage devices 1421 and 1422 are DIMMs. Storage device 1421 is communicatively coupled to sideband channel management bus 1431. Storage device 1422 is communicatively coupled to sideband channel management bus 1432. Communications on sideband channel management bus 1431 and 1432 do not interfere with communications on command/address buses and data buses 1450.

Figure 11:
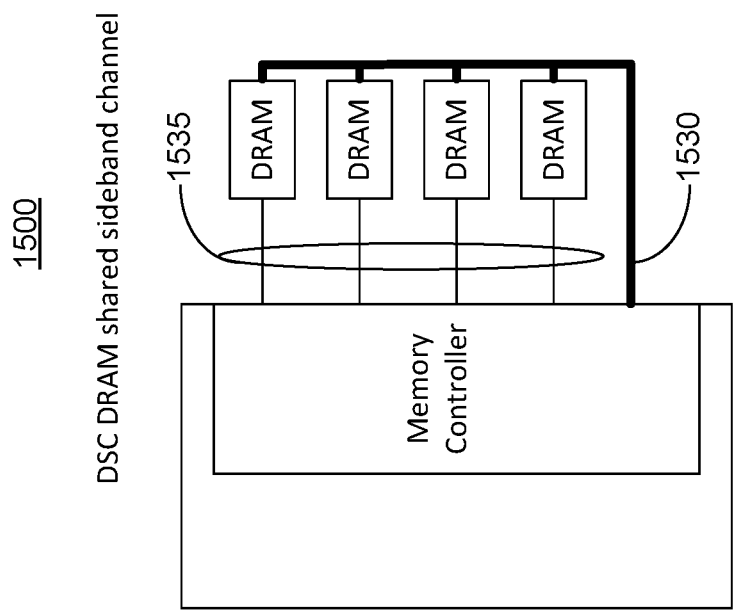
FIG. 11 is a block diagram of an exemplary storage system in a Discrete DRAM shared sideband channel configuration in accordance with one embodiment.

FIG. 11 is a block diagram of a storage system 1500 in a Discrete DRAM shared sideband channel configuration in accordance with one embodiment. Communications on sideband channel management bus 1530 does not interfere with the communications on command/address buses and data buses 1535.

Figure 12:
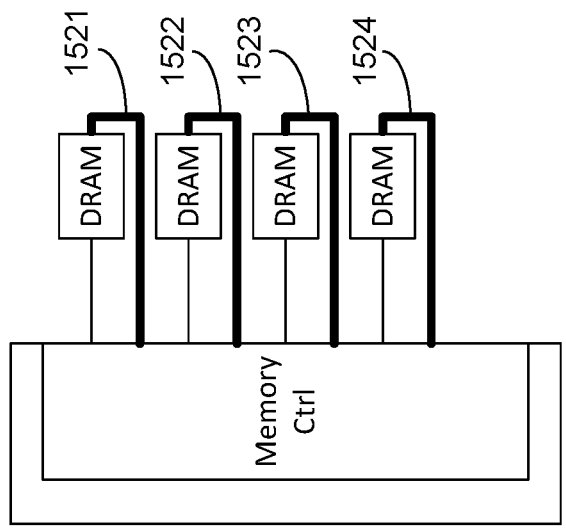
FIG. 12 is a block diagram of an exemplary storage system in a Per-Discrete DRAM shared sideband channel configuration in accordance with one embodiment.

FIG. 12 is a block diagram of a storage system 1550 in a Per-Discrete DRAM shared sideband channel configuration in accordance with one embodiment. Communications on sideband channel management buses 1521, 1522, 1523, and 1524 respectively do not interfere with communications on the respective command/address buses and data buses.

Figure 6:
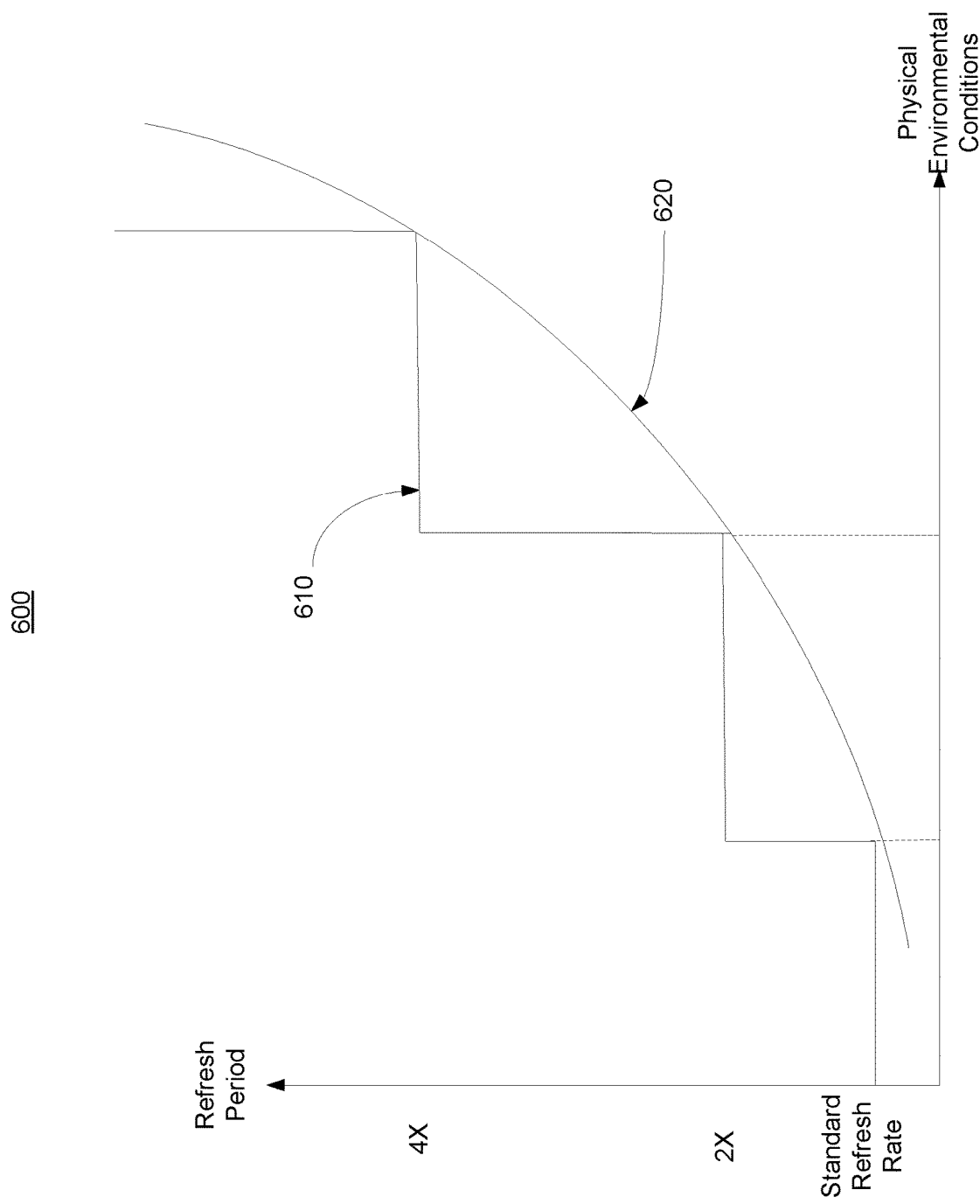
FIG. 6 is a graph illustrating an exemplary storage management curve in accordance with one embodiment.

In one embodiment, a storage management system and method refresh cycle rate is relatively continuous rather than one or two distinct rates, unlike some conventional DRAM protocols which have a single refresh rate for standard operation and one faster rate for operation above a temperature threshold. FIG. 6 is a graph illustrating a storage management curve in accordance with one embodiment. The traditional staircase 610 increments are relatively extreme compared to the curve 620. In one embodiment, the curve 620 corresponds to refresh requests communicated via a management communication channel or bus (e.g., bus 130, 230, etc.). Adjustments corresponding to curve 620 facilitate a smoother more granular refresh rate transition than the step function. The smoother more granular approach helps avoid over-refreshing that can occur with the step 610 increments. In one exemplary implementation, the curve 620 corresponds to both a DRAM's required and potentially actual refresh rate delivered via a management communication channel or bus.

The management sideband communications can be accomplished over a new protocol or can leverage an existing bus protocol (e.g. UART bus, SPI bus, SMI bus, I2C bus, I3C bus, etc.). In one embodiment, the management sideband communications are implemented on an I2C interface. The DRAM is the master and the SoC with the memory controller is a slave. In one embodiment, the configuration is a multi-master and single slave configuration. In one embodiment all devices can act as masters. In one exemplary implementation, this facilitates asynchronous event notification. In one embodiment, two shared wires are connected to the DRAMS. The SoC can provide a clock source to the DRAM utilizing a third wire. The DRAMS can identify themselves with a die number. The die numbers can be assigned through mode register writes during initialization. In one embodiment, the fastest refresh rate requested on each DRAM channel is applied to all DRAMs on that channel. In one exemplary implementation, a function field defined in the packet format defines what type of notification the DRAM is making to a host (e.g., CPU, SoC, etc.). Additional function types can be defined for other event notifications. These functions can include: request to insert an extra refresh cycle for a single storage bank or a plurality of storage banks, communicating error information to a host (e.g., to facilitate data migration, page blacklisting at the system level via hardware or software, etc.), notification of DRAM die temperature threshold crossings, and so on.

In one embodiment, a management communication bus or channel separated from a command/address command bus or channel is considered a sideband interface between a DRAM and a memory controller (MC). The sideband interface can permit the DRAM to request refresh. In one embodiment, a MC maintains control of the DRAM sequencing but allows the DRAM to demand or request extra refresh cycles. Since the management information is a sideband request (e.g., rather than a polling, back-off, wait, etc.), in one embodiment the sideband provides at least the minimum information associated with knowing the extra refresh needs of the DRAM (e.g., does the DRAM need to perform refresh to a specific bank or to multiple banks, or a global refresh rate change, etc.).

It is appreciated that a variety of embodiments and configurations can be implemented. A management sideband interface between a memory controller and a DRAM can permit the DRAM to send messages or commands to a memory controller. The management sideband interface between a memory controller and a DRAM can communicate one or more of the following messages from the DRAM: a request for Refresh from a DRAM indicating a specific bank or all banks, notification of DRAM die temperature change, notification of DRAM die temperature threshold crossing, request increase/decrease of refresh rate, a general interrupt signaling the MC to read an internal Interrupt Status Register, signal bank/row address of internal ECC failure, signal uncorrectable error, signal statistics of ECC (although a ECC error threshold crossing might be signaled by the interrupt already mentioned), handshake secure keys, respond to requests to read contents of MRR, upon autonomous register change, push register update to MC or storage device, notification of row hammer access threshold being exceeded to bank N/Row M (and hence appropriate action being taken—e.g. refresh to an adjacent row based upon MC knowledge of the construction of the particular DRAM), and notification that the storage device is not yet available on exit from SELF-REFRESH.

It is appreciated that this description includes some exemplary embodiments and other embodiments can also be utilized to implement the novel memory allocation approach or scheme. The new approach can be implemented in various systems and components with different configurations. The components can be included in a system on a chip (e.g., multiple processing components, processing engines, etc.). The components can also be discrete separate components.

Figure 13:
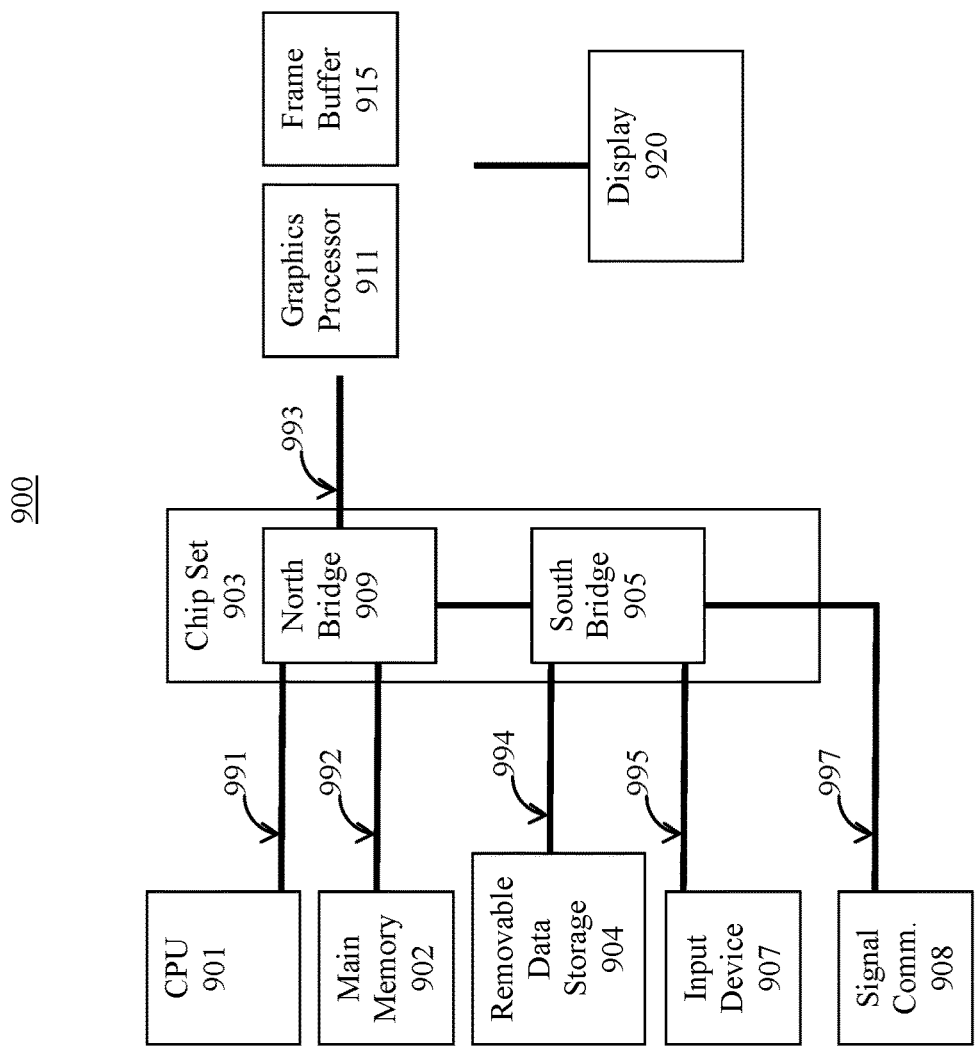
FIG. 13 is a block diagram of an exemplary computer system upon which embodiments of the present invention can be implemented.

With reference to FIG. 13, a block diagram of an exemplary computer system 900 is shown, one embodiment of a computer system upon which embodiments of the present invention can be implemented. Computer system 900 includes central processor unit 901, main memory 902 (e.g., random access memory), chip set 903 with north bridge 909 and south bridge 905, removable data storage device 904, input device 907, signal communications port 908, and graphics subsystem 910 which is coupled to display 920. Computer system 900 includes several busses for communicatively coupling the components of computer system 900. Communication bus 991 (e.g., a front side bus) couples north bridge 909 of chipset 903 to central processor unit 901. Communication bus 992 (e.g., a main memory bus) couples north bridge 909 of chipset 903 to main memory 902. Communication bus 993 (e.g., the Advanced Graphics Port interface) couples north bridge of chipset 903 to graphic subsystem 910. Communication buses 994, 995 and 997 (e.g., a PCI bus) couple south bridge 905 of chip set 903 to removable data storage device 904, input device 907, signal communications port 908 respectively. Graphics subsystem 910 includes graphics processor 911 and frame buffer 915.

The components of computer system 900 cooperatively operate to provide versatile functionality and performance. In one exemplary implementation, the components of computer system 900 cooperatively operate to provide predetermined types of functionality. Communications bus 991, 992, 993, 994, 995 and 997 communicate information. Central processor 901 processes information. Main memory 902 stores information and instructions for the central processor 901. Removable data storage device 904 also stores information and instructions (e.g., functioning as a large information reservoir). Input device 907 provides a mechanism for inputting information and/or for pointing to or highlighting information on display 920. Signal communication port 908 provides a communication interface to exterior devices (e.g., an interface with a network). Display device 920 displays information in accordance with data stored in frame buffer 915. Graphics processor 911 processes graphics commands from central processor 901 and provides the resulting data to video buffers 915 for storage and retrieval by display monitor 920.

Thus, the systems and methods facilitate effective utilization of separate communication medium for management operations and do not interfere with command, address, or data communications between a memory controller and storage component. Indeterminate latency can make DRAM controller design and isochronous latency guarantees more complex, whereas the sideband management is simpler and more efficient than conventional approaches. In one embodiment, the separate sideband management communication can facilitate avoidance of the DRAM autonomously beginning a refresh internal to the DRAM unbeknownst to the memory controller; unlike conventional DRAMs have usually been slave-only devices. In one embodiment, information communicated via a management communication bus is used to facilitate new and useful sequences issued a memory controller, including those achieving higher performance and/or lower power.

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

It is appreciated that embodiments of the present invention can be compatible and implemented with a variety of different types of tangible memory or storage (e.g., RAM, DRAM, flash, hard drive, CD, DVD, etc.). The memory or storage, while able to be changed or rewritten, can be considered a non-transitory storage medium. By indicating a non-transitory storage medium it is not intend to limit characteristics of the medium, and can include a variety of storage mediums (e.g., programmable, erasable, nonprogrammable, read/write, read only, etc.) and "non-transitory" computer-readable media comprises all computer-readable media, with the sole exception being a transitory, propagating signal.

It is appreciated that the following is a listing of exemplary concepts or embodiments associated with the novel approach. It is also appreciated that the listing is not exhaustive and does not necessarily include all possible implementation. The following concepts and embodiments can be implemented in hardware. In one embodiment, the following methods or process describe operations performed by various processing components or units. In one exemplary implementation, instructions, or directions associated with the methods, processes, operations etc. can be stored in a memory and cause a processor to implement the operations, functions, actions, etc.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents. The listing of steps within method claims do not imply any particular order to performing the steps, unless explicitly stated in the claim.

The invention claimed is:

1. A system comprising:
   a storage component that stores information and performs a refresh of itself at a refresh cycle rate;
   a memory controller; and
   a communication link that communicatively couples the storage component and the memory controller, wherein the communication link comprises:
      a data bus that communicates data between the storage component and the memory controller;
      a command and address bus that communicates commands and addresses from the memory controller to the storage component; and
      a management communication bus that communicates storage system management information between the storage component and the memory controller, wherein the management information comprises a request from the storage component to the memory controller requesting that the refresh cycle rate be changed, and wherein the memory controller responds to the request by instructing the storage component to change the refresh cycle rate at which the storage component refreshes itself in its entirety in response to the request.

2. The system of claim 1, wherein the storage component is a dynamic random access memory (DRAM).

3. The system of claim 1, wherein the communication of the storage system management information on the management communication bus is a sideband communication.

4. The system of claim 1, wherein the storage system management information comprises status information forwarded from the storage component to the memory controller, and wherein the status information is an indication relating to a portion of the storage component.

5. The system of claim 4, wherein the portion of the storage device is selected from the group consisting of: a bit of memory, a byte of memory, a row of memory, a block of memory, and a page of memory.

6. A method comprising:
receiving, by a memory controller, storage system management information from a storage component over a management communication bus of a communication link between the memory controller and the storage component, wherein the storage system management information includes a request to change a refresh cycle rate of the storage component;
analyzing, by the memory controller, the storage system management information; and
selectively issuing instructions, by the memory controller, to the storage component over the management communication bus to change the refresh cycle rate at which the storage component refreshes itself in its entirety in response to the request.

7. The method of claim 6, wherein the step of selectively issuing instructions includes the step of considering the impacts of the instructions on both data storage operations and storage system management requirements.

8. The method of claim 6, wherein the instructions result in dynamic adjustment of the storage system management operations.

9. The method of claim 6, wherein the storage component is a dynamic random access memory (DRAM).

10. The method of claim 6, wherein the communication of the storage system management information on the management communication bus is a sideband communication.

11. The method of claim 6, wherein the storage system management information comprises status information forwarded from the storage device to the memory controller, and wherein the status information is an indication relating to a portion of the storage component.

12. The method of claim 11, wherein the portion of the storage component is selected from the group consisting of: a bit of memory, a byte of memory, a row of memory, a block of memory, and a page of memory.

* * * * *